United States Patent
Chou et al.

(10) Patent No.: US 8,164,958 B2
(45) Date of Patent: Apr. 24, 2012

(54) MEMORY APPARATUS AND METHOD FOR OPERATING THE SAME

(75) Inventors: Tsung-Yi Chou, Hsinchu (TW); Loen-Shien Tsai, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 313 days.

(21) Appl. No.: 12/419,470

(22) Filed: Apr. 7, 2009

(65) Prior Publication Data

US 2010/0254194 A1    Oct. 7, 2010

(51) Int. Cl.
*G11C 11/34* (2006.01)

(52) U.S. Cl. ......... 365/185.21; 365/185.18; 365/185.01; 365/185.02; 365/185.03; 365/185.14; 365/185.17; 365/185.2; 365/185.22; 365/185.23; 365/185.24; 365/185.28; 365/185.33; 365/185.15; 365/189.16; 365/189.07

(58) Field of Classification Search .......... 365/185.21, 365/185.18, 185.01, 185.02, 185.03, 185.14, 365/185.17, 185.2, 185.22, 185.23, 185.24, 365/185.28, 185.33, 185.15, 189.16, 189.07, 365/189.09

See application file for complete search history.

(56) References Cited

U.S. PATENT DOCUMENTS

| | | | | |
|---|---|---|---|---|
| 6,744,670 | B2* | 6/2004 | Tamada et al. | 365/185.19 |
| 7,808,837 | B2* | 10/2010 | Misumi | 365/185.28 |
| 2006/0209593 | A1* | 9/2006 | Toda | 365/185.03 |
| 2007/0171746 | A1* | 7/2007 | Tsao et al. | 365/207 |
| 2007/0187775 | A1* | 8/2007 | Okhonin et al. | 257/370 |
| 2010/0214841 | A1* | 8/2010 | Chou | 365/185.18 |
| 2011/0007577 | A1* | 1/2011 | Chou et al. | 365/189.07 |

* cited by examiner

*Primary Examiner* — Fernando Hidalgo

(74) *Attorney, Agent, or Firm* — J.C. Patents

(57) ABSTRACT

The invention provides a method for reading a first data storage of a memory cell. The method comprises sensing a first current of the memory cell by applying a first bit line voltage on the memory cell. When the first current is larger than a first reference current with respect to the first bit line voltage, the first data storage is determined to be at an unprogrammed state. Otherwise, a second current of the memory cell is sensed by applying a second bit line voltage on the memory cell. When the difference between the first current and the second current is larger than the difference between the first reference current and the second reference current, the first data storage is determined to be at the unprogrammed state. Otherwise, the first data storage is determined to be at a programmed state.

14 Claims, 8 Drawing Sheets

MEMORY APPARATUS AND METHOD FOR OPERATING THE SAME

BACKGROUND OF THE INVENTION

1. Field of Invention

The present invention relates to methods for operating a memory and a memory apparatus. More particularly, the present invention relates to methods and memory apparatus for reducing the second bit effect in memory apparatus.

2. Description of Related Art

A memory is a semiconductor device designed for storing information or data. As the functions of computer microprocessors become more and more powerful, programs and operations executed by software are increasing correspondingly. Consequentially, the demand for high storage capacity memories is getting more.

Among various types of memory products, a non-volatile memory allows multiple-time data programming, reading and erasing operations, and the data stored therein can be retained even after the power to the memory is terminated. With these advantages, the non-volatile memory has become one of the most widely adopted memories for personal computers and electronic equipment.

Electrically programmable and erasable non-volatile memory technologies based on charge storage structures known as Electrically Erasable Programmable Read-Only Memory (EEPROM) and flash memory are used in a variety of modern applications. A flash memory is designed with an array of memory cells that can be independently programmed and read. Conventional flash memory cells store charge on a floating gate. Another type of flash memory uses a charge-trapping structure, such as a layer of non-conductive SiN material, rather than the conductive gate material used in floating gate devices. When a charge-trapping cell is programmed, the charge is trapped and does not move through the non-conductive layer. The charge is retained by the charge trapping layer until the cell is erased, retaining the data state without continuously applied electrical power. Charge-trapping cells can be operated as two-sided cells. That is, because the charge does not move through the non-conductive charge trapping layer, charge can be localized on different charge-trapping sites. On the other words, in the flash memory devices with the use of the charge-trapping structure, more than one bit of information is stored in each memory cell.

A single memory cell can be programmed to store two physically separated bits in the charge-trapping structure, in the form of a concentration of charge near the source region and another concentration of charge near the drain region. Programming of the memory cell can be performed by Channel Hot Electron (CHE) injection, which generates hot electrons in the channel region. Some of these hot electrons gain enough energy to become trapped in the charge-trapping structure. By interchanging the biases applied to the source and drain terminals, the charge is trapped either in a portion of the charge-trapping structure near the source region, near the drain region, or both.

Accordingly, for example, if no charge is stored in the memory cell, the threshold voltage of the memory cell has a minimal value corresponding to a combination of bits 1 and 1. If charge is stored in the charge-trapping structure near the source region, but not near the drain region, the threshold voltage has a different value corresponding to a combination of bits 1 and 0, for example. The threshold voltage has yet another value if charge is stored near the drain region but not near the source region. In that case, the threshold voltage corresponds to a combination of bits 0 and 1. Lastly, if charge is stored near both the source and the drain region, the threshold voltage is at its highest, and corresponds to a combination of bits 0 and 0. Thus, four distinct combinations of bits 00, 01, 10 and 11 can be stored, and each combination has a corresponding threshold voltage. During a read operation, current flowing through the memory cell will vary depending upon the threshold voltage of the cell. Typically, such current will have four different values, each corresponding to a different threshold voltage. Accordingly, by sensing such current, the particular bit combination stored in the cell can be determined.

The total available charge range or the threshold voltage range may be referred to as memory operation window. In other words, memory operation window is defined by the difference between program level and erase level. A large memory operation window is desirable because good level separation between states is needed for cell operation. The performance of two-bit memory cells, however, is often degraded by the so-called "second bit effect" in which localized charges in the charge-trapping structure interact with each other. For example, during a reverse read operation, a read bias is applied to the drain terminal and the charge stored near the source region (i.e., a "first bit") is sensed, then the bit near the drain region (i.e., the "second bit"), however, creates a potential barrier for reading the first bit near the source region. This barrier may be overcome by applying a bias with a suitable magnitude, using the drain-induced barrier lowering (DIBL) effect to suppress the effect of the second bit near the drain region and allow the sensing of the storage status of the first bit. However, when the second bit near the drain region is programmed to a high threshold voltage state and the first bit near the source region is at un-programmed state, the second bit raises this barrier substantially. Therefore, as the threshold voltage associated with the second bit increases, the read bias for the first bit becomes insufficient to overcome the potential barrier created by the second bit. As a result, the threshold voltage associated with the first bit is raised as a result of the increasing threshold voltage of the second bit, thereby reducing the memory operation window. The second bit effect decreases the memory operation window for 2-bit/cell operation. Therefore, there is a need for methods and devices for suppressing the second bit effect in memory devices.

SUMMARY OF THE INVENTION

Accordingly, the present invention provides a method for reading a memory cell capable of alleviating the second bit effect.

The present invention also provides a method for operating a memory cell capable of reducing operation window.

To achieve these and other advantages and in accordance with the purpose of the invention, as embodied and broadly described herein, the invention provides a method for operating a memory cell having a first data storage and a second data storage. The method comprises sensing a first current of the memory cell with applying a first bit line voltage onto the memory cell. When the first current is larger than a first reference current with respect to the first bit line voltage, the first data storage is determined to be at an un-programmed state. When the first current is smaller than the first reference current, a second current of the memory cell is sensed with applying a second bit line voltage onto the memory cell. Thereafter, when a first difference between the first current and the second current is larger than a second difference between the first reference current and the second reference current, the first data storage is determined to be at the unprogrammed state. However, when the first difference is smaller than or equal to the second difference, the first data storage is determined to be at a programmed state.

According to the embodiment of the present invention, the second bit line voltage is different from the first bit line voltage.

According to the embodiment of the present invention, the second bit line voltage is larger than the first bit line voltage.

According to the embodiment of the present invention, a first word line voltage for sensing the first current is equal to a second word line voltage for sensing the second current.

According to the embodiment of the present invention, the method further comprises defining a program verify voltage of the memory cell and defining an upper bound of a low threshold voltage distribution of the memory cell. Moreover, the difference between the program verify voltage and the upper bound of the low threshold voltage distribution is about 600 mV.

The invention also provides a memory apparatus. The memory apparatus comprises a memory and a controller. The memory has a plurality of memory cells. Each of the memory cells has a first data storage and a second data storage. The controller is used for applying a reading process on each of the memory cells. For each of the memory cells, the reading process comprises sensing a first current of the memory cell with applying a first bit line voltage onto the memory cell. When the first current is larger than a first reference current with respect to the first bit line voltage, the first data storage is determined to be at an un-programmed state. When the first current is smaller than the first reference current, a second current of the memory cell is sensed with applying a second bit line voltage onto the memory cell. Thereafter, when a first difference between the first current and the second current is larger than a second difference between the first reference current and the second reference current, the first data storage is determined to be at the un-programmed state. However, when the first difference is smaller than or equal to the second difference, the first data storage is determined to be at a programmed state.

The invention provides a memory apparatus. The memory apparatus comprises a memory a sense circuit and a controller. The memory has a plurality of memory cells. Each of the memory cells has a first data storage and a second data storage. The sense circuit is used for sensing a first current of the memory cell with applying a first bit line voltage onto the memory cell during a reading process, wherein when the first current is smaller than a first reference current with respect to the first bit line voltage, the sense circuit senses a second current of the memory cell with applying a second bit line voltage onto the memory cell. The controller is used for applying a reading process on each of the memory cells with referring to program verify voltage. For each of the memory cells, the reading process comprises sensing a first threshold voltage of the first data storage and then determining that the first data storage is at a un-programmed state when the first threshold voltage is smaller than the program verify voltage In the present invention, when reading data from each data storage in the memory cell, the behavior of the threshold voltage distribution of the target data storage under different bit line voltage is used to determine the programmed state of the target data storage. Thus, even if the operation window is small and even closed, the data storage with bit of "1" under second bit effect and the data storage with bit of "0" can be correctly distinguished from each other while the sensing current is smaller than the reference current. Therefore, the operation window would no longer be a barrier for scaling down the dimension of the memory cell. Furthermore, the second bit effect on the operation of the memory cell is alleviated. Furthermore, since the second bit effect is alleviated and the operation window is small, the programming speed is increased and the time for programming the memory cell is reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
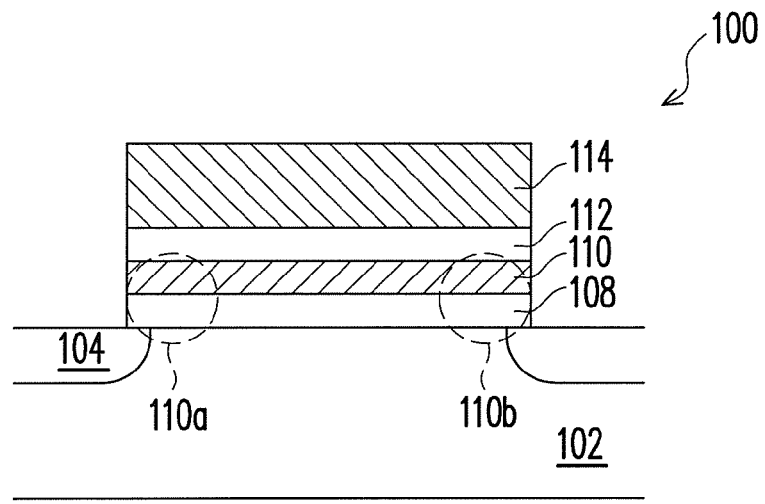
FIG. 1 is a sectional view of a memory cell according to one embodiment of the present invention.

FIG. 1 is a sectional view of a memory cell according to one embodiment of the present invention. As shown in FIG. 1, the memory cell 100 has a substrate 102 having two source/drain regions 104 formed therein. A bottom isolation layer 108 of the memory cell 100 is formed over the channel between the source/drain regions 104. On top of the electrical isolation layer 108 is a charge trapping layer 110, which is electrically isolated from the substrate 102 by the isolation layer 108. The hot electrons are trapped as they are injected into the charge trapping layer 110, such that the threshold voltage of the memory cell 100 would be adjusted under control. A top isolation layer 112 are formed over the charge trapping layer 110 to electrically isolate a conductive gate 114 from the charge trapping layer 110. The memory cell 100 has a first data storage 110a near one of the source/drain regions 104 and a second data storage 110b near the other one of source/drain regions 104. Each of the first data storage 110a and the second data storage 110b is programmable to store one bit of data. Therefore, two bits of data could be stored in the memory cell 100.

When the first data storage 110a is programmed, voltages are applied onto the conductive gate 114 and one of the source/drain regions 104 near the first data storage such that vertical and lateral electrical fields are created to accelerate electrons from the other one of the source/drain regions 104 away from the first data storage 110a along the channel of the memory cell 100. As the electrons move along the channel, some of the electrons gain sufficient energy to jump over the potential barrier of the bottom isolation layer 108 and become trapped in the charge trapping layer 110 around the first data storage 110a. Consequently, as the situation that the un-programmed state of a bit is defined to be the logic "1", a threshold voltage of the first data storage 110a is increased, and the bit of the first data storage 110a is altered from "1" to "0", i.e. form a first logic state to a second logic state. Similarly, when programming the second data storage 110b, voltages are applied to the conductive gate 114 and one of the source/drain regions 104 near the second data storage 110b to force electrons to be trapped in the charge trapping layer 110 around the second data storage 110b. Therefore, a threshold voltage of the second data storage 110b would be increased, and the bit of the second data storage 110b is altered from "1" to "0".

Figure 2:
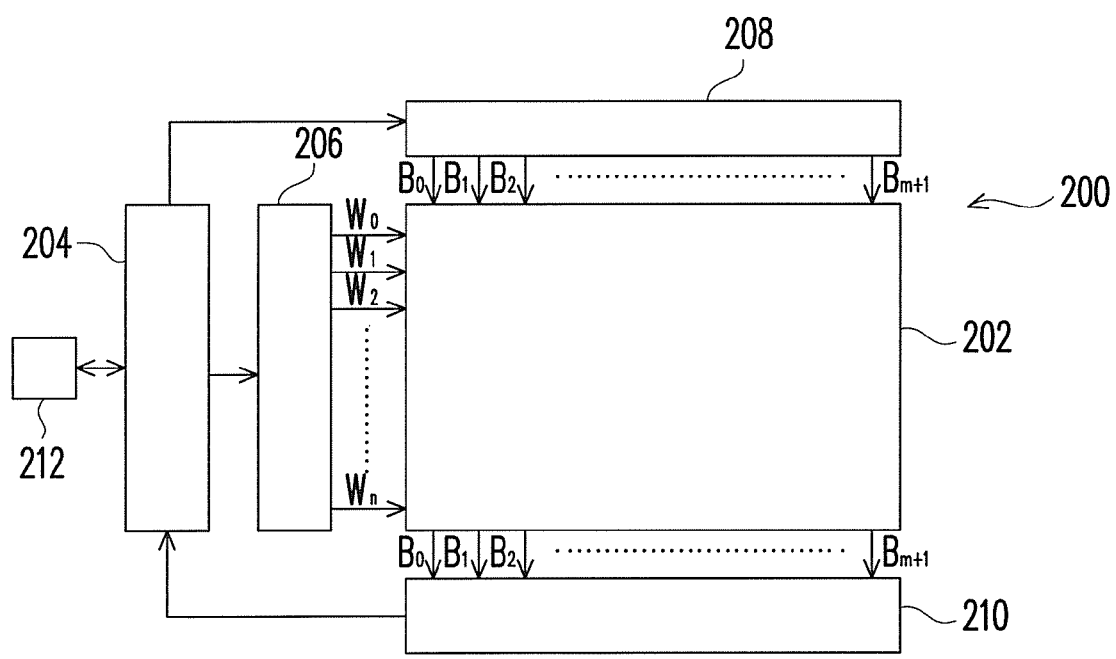
FIG. 2 is a functional block diagram of a memory apparatus according to one embodiment of the present invention.
Figure 3:
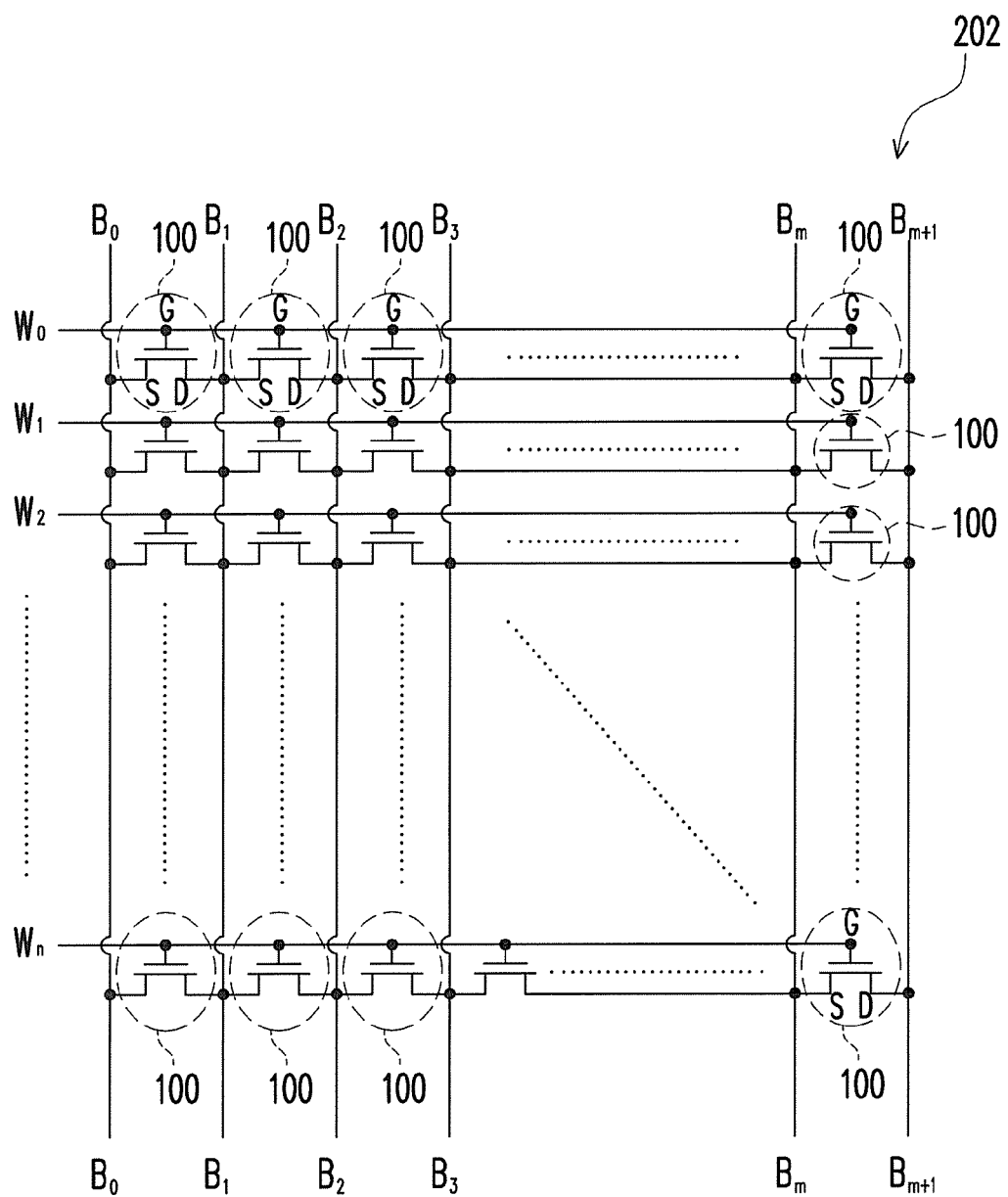
FIG. 3 is a circuit diagram of a memory of the memory apparatus shown in FIG. 2.

FIG. 2 is a functional block diagram of a memory apparatus according to one embodiment of the present invention. FIG. 3 is a circuit diagram of a memory of the memory apparatus shown in FIG. 2. As shown in FIG. 2 and FIG. 3, a memory apparatus 200 has the memory 202, a controller 204, a row decoder 206, a column decoder 208, a sense circuit 210, and an analog-to-digital converter 212. The memory 202 has a plurality of the memory cells 100 (as shown in FIG. 1). The memory cells 100 of the memory 202 are arranged in an array with n rows and m columns, where n and m are integers greater than 1. The controller 204 is coupled to the row decoder 206 and the column decoder 208 to control the operations of the memory cells 100 of the memory 202. The analog-to-digital converter 212 is coupled to the controller 204 for converting the sensed currents and reference currents to be in form of digital values respectively. The row decoder 206 applies world line voltages to the conductive gates 114 of the memory cells 100 via a plurality of word lines W0-Wn of the memory apparatus 200. The column decoder 208 applies bit line voltages to the memory cells 100 via a plurality of bit lines B0-Bm+1 of the memory apparatus 200. As shown in FIG. 1 and FIG. 3, the conductive gate 114 of each of the memory cells 100 is coupled to a corresponding one of the word lines W0-Wn. The source/drain regions 104 of each of the memory cells 100 are coupled to two adjacent bit lines of the bit lines B0-Bm+1. For example, the conductive gate of the most left-top memory cell 100 is coupled to the word line W0, and the source/drain regions of the most left-top memory cell 100 are coupled to the bit lines B0 and B1 respectively.

When data information is read from the one data storage of a memory cell 100, the conductive gate 114 of the memory cell 100 is applied with a word line voltage (e.g. 5V) via a corresponding one of the word lines W0-Wn, one of the source/drain regions near the data storage under reading operation is grounded, and the other one of the source/drain regions near the other data storage is applied with a bit line voltage (e.g. 1.6V) via a corresponding one of the bit lines B0-Bm+1. As shown in FIG. 1, when the bit of the first data storage 110a of the memory cell 100 is read, the conductive gate 114 is applied with the word line voltage, one of the source/drain regions 104, near the first data storage 110a, is grounded, and the other one of the source/drain regions 104 is applied with the second bit line voltage. If the word line voltage is higher than the threshold voltage of the first data storage 110a, the channel between the source/drain regions 104 is turned on, and a current flows from the source/drain region 104, which away from the first data storage 110a, through the source/drain region 104, which is near the first data storage 110a, and a corresponding one of the bit lines B0-Bm+1 to the sense circuit 210. However, if the word line voltage is less than the threshold voltage of the first data storage 110a, the channel between the source/drain regions 104 is turned off, and the sense circuit 210 senses no current from the memory cell 100. Therefore, the sense circuit 210 could determine which logic state of the bit of first data storage 110a by detecting the current from the memory 100. Similarly, when reading the bit of the second data storage 110b of the memory cell 100, the conductive gate 114 is applied with a word line voltage, the source/drain region 104, which is away from the second data storage 110b, is applied with a bit line voltage, and the source/drain region 104, which is near the second data storage 110b, is grounded. If the word line voltage is higher than the threshold voltage of the second data storage 110b, the channel between the source/drain regions 104 is turned on, and a current flows from the source/drain region 104, which is away from the second data storage 110b, through the source/drain regions 104, which are near the second data storage 110b, and a corresponding one of the bit lines B0-Bm+1 to the sense circuit 210. However, if the word line voltage is less than the threshold voltage of the second data storage 110b, the channel between the source/drain regions 104 is turned off, and the sense circuit 210 senses no current from the memory cell 100.

Figure 4A:
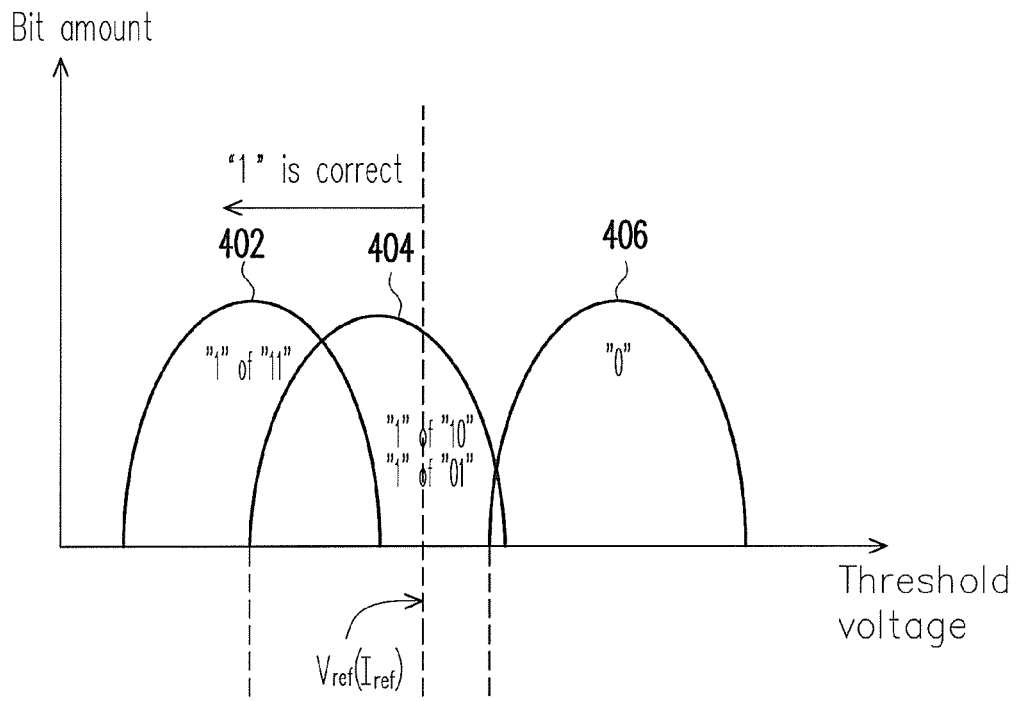
FIG. 4A is a diagram shows threshold voltage distributions of the memory cells of the memory when a first current is sensed as the circumstance that the memory cells have been programmed according to one embodiment of the present invention.
Figure 4B:
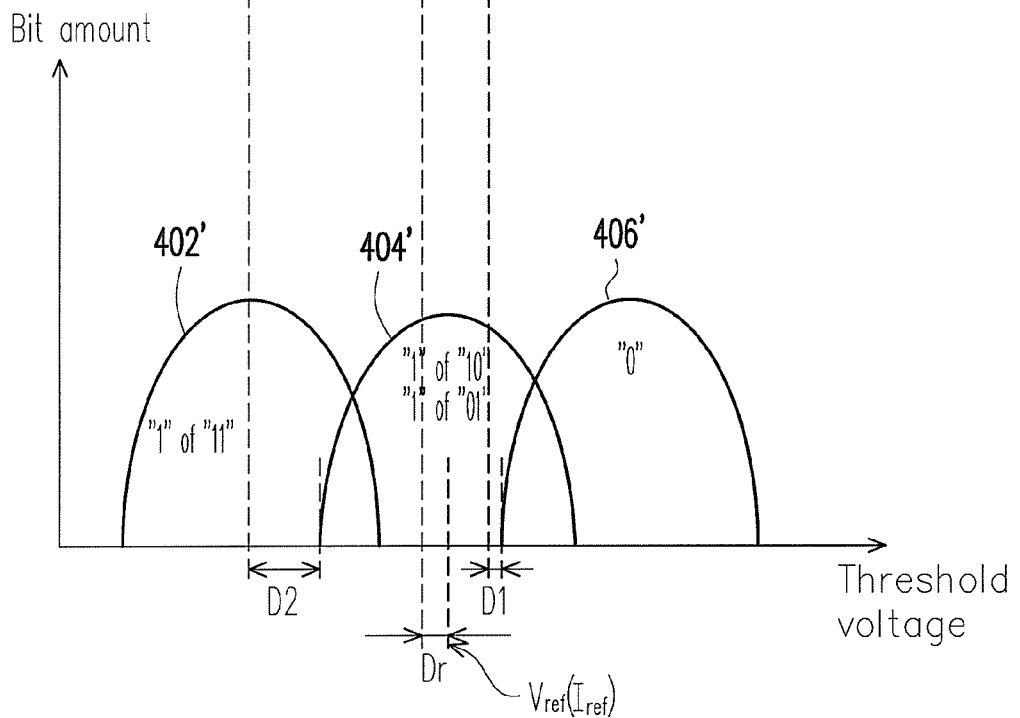
FIG. 4B is a diagram shows threshold voltage distributions of the memory cells of the memory when a second current is sensed as the circumstance that the memory cells have been programmed according to one embodiment of the present invention.

For a two-bit storage memory cell like the memory cell, there are at least four programmed states including 11, 01, 10 and 00. In this embodiment, the un-programmed state of the memory cell is defined as logic "11". Therefore, when both of the first data storage and the second data storage are programmed, the programmed state of the memory cell is defined as logic "00". Furthermore, each programmed state of the memory cell can be represented by a corresponding threshold voltage distribution. FIG. 4A is a diagram shows threshold voltage distributions of the memory cells of the memory when a first current is sensed as the circumstance that the memory cells have been programmed according to one embodiment of the present invention. FIG. 4B is a diagram shows threshold voltage distributions of the memory cells of the memory when a second current is sensed as the circumstance that the memory cells have been programmed according to one embodiment of the present invention. As shown in FIG. 4A, the horizontal axis in FIG. 4A represents the word line voltage of each of the data storages 110a and 110b of the memory cells 100, and the vertical axis represents the amount of the bits that are stored by the data storages 110a and 110b of the memory cells 100. As shown in FIG. 4A, a first threshold voltage distribution 402 indicates the distribution of threshold voltages of the bits "1" of the memory cells 100 with a "11" programmed state. On the other words, the first threshold voltage distribution 402 is the low threshold voltage distribution of the un-programmed bit of the memory cell while both of the first data storage and the second data storage of the memory cell are at the un-programmed state.

Also, the second threshold voltage distribution 404 indicates the distribution of threshold voltages of the bits "1" of the memory cells 100 with "01" and "10" programmed states. That is, the second threshold voltage distribution 404 represents the threshold voltage distribution of the un-programmed bit of the memory cell while one of the first data storage or the second data storage is programmed. On the other words, the second threshold voltage distribution 404 is the threshold voltage distribution of the un-programmed bit of the memory cell under a second bit effect. The third threshold voltage distribution 406 indicates the distribution of threshold voltages of the bits "0" of the memory cells 100. On the other words, the third threshold voltage distribution 406 represents the threshold voltage distribution of the programmed bit of the memory cell.

As shown in FIG. 4A, the second threshold voltage distribution 404 not only partially overlaps with the first threshold voltage distribution 402 but also partially overlaps with the third threshold voltage distribution 406. It is clear that the operation window for reading the data information of the memory cell is very small and even closed. The present invention provides an operation method for reading the data information store in one of the first data storage 110a and the second data storage 110b. By applying the operation method of the present invention, the un-programmed state of the data storage under the second bit effect can be easily distinguished over the programmed state of the data storage even though the second threshold voltage distribution 404 overlaps with the third threshold voltage distribution and the operation window for the reading operation is closed.

Figure 5:
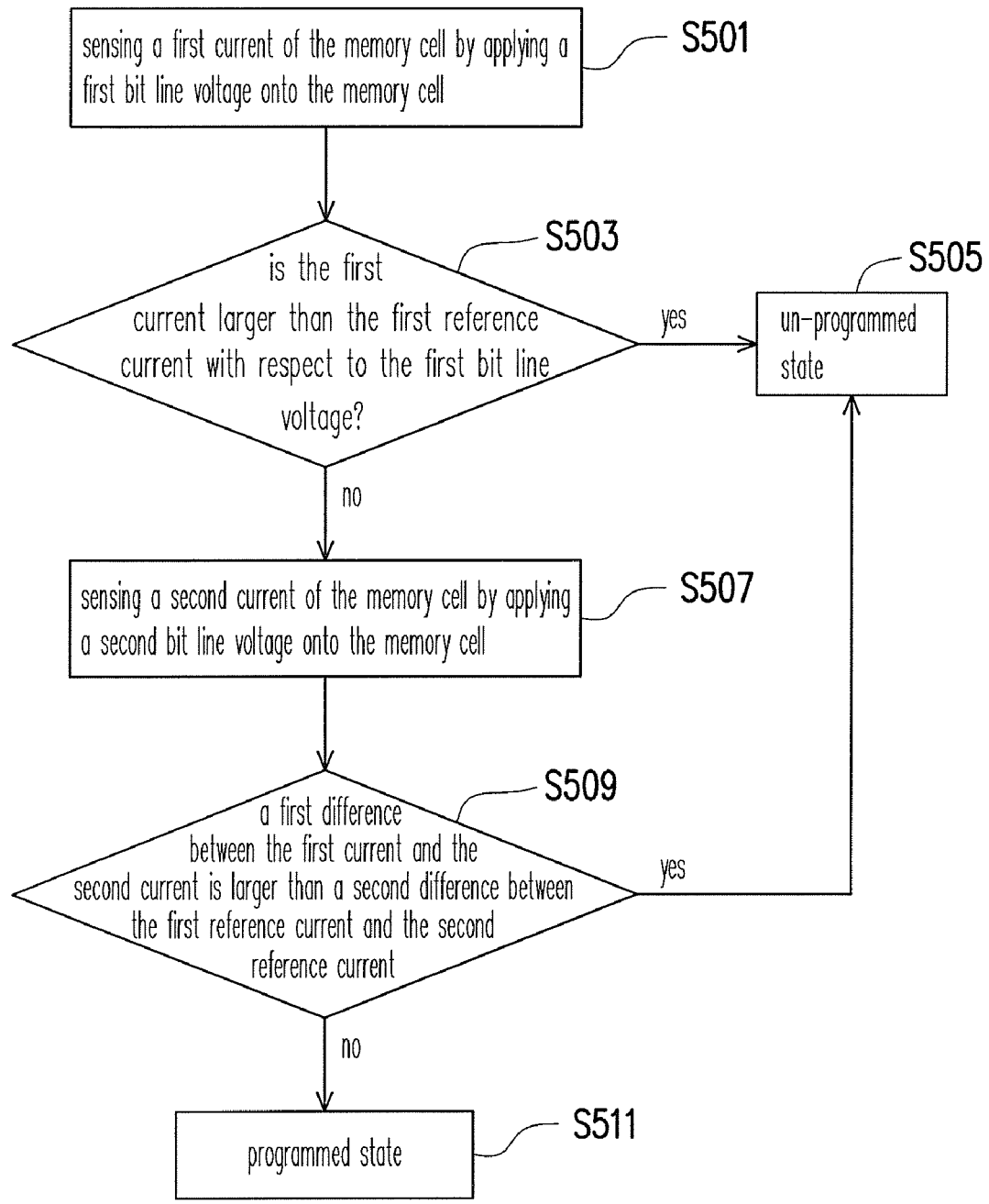
FIG. 5 is a flow chart showing a method for reading a memory cell of the memory according to one embodiment of the present invention.

FIG. 5 is a flow chart showing a method for reading a memory cell of the memory according to one embodiment of the present invention. When reading data information of the first data storages 110a in the memory cells 100, the controller 204 applies a reading process by applying a word line voltage to the conductive gates 114 of the memory cells 100 via the word lines W0-Wn and applying a bias between the source/drain regions 104 of the memory cells 100. That is, the bias applied between the source/drain regions 104 is carried out by applying a first bit line voltage onto the source/drain region 104, which is away from the first data storage 110a, and grounding the source/drain region 104 near the first data storage 110b. As shown in FIG. 5, a first current induced by the first bit line voltage on the source/drain region 104 is sensed (step S501).

In the step S503, the first current is compared with a first reference current with respect to the first bit line voltage and the word line voltage applied onto the memory cell 100. Typically, for reading data information in a memory cell, a predetermined and fixed word line voltages is applied onto the conductive gate 114 and a predetermined and fixed bit line voltage is applied onto one of the source/drain 104 away from the to-be-read data storage. The generated current is mapped to a programmed state by comparing it with a reference current with respect to the word line voltage and the bit line voltage applied onto the memory cell. If the current read is higher than the reference current, the memory cell is determined to be in one logic state (i.e. un-programmed state). On the other hand, if the current is less than the reference current, the memory cell is determined to be in the other logical state (i.e. programmed state).

Therefore, in the step S505, when the first current is larger than the first reference current with respect to the first bit line voltage, the first data storage is determined to be at an un-programmed state. In terms of threshold voltage of the first data storage 110a, the higher the current is, the lower the threshold voltage is. Hence, when the first current is larger than the first reference current with respect to the first bit line voltage, the threshold voltage of the first data storage 110a is smaller than the reference voltage with respect to the reference current. As shown in FIG. 4A, the reference voltage with respect to the reference current is higher than the upper bound of the first threshold voltage distribution 402 and partial of the second threshold voltage distribution 404 so that all bits having the threshold voltages smaller than the reference voltage could be correctly distinguished to be the logic "1" and no bit of logic "0" would be erroneously determined to be the logic "1". Therefore, when reading data information from the first data storage 110a of the memory cells 100 with sensing the first current higher than the reference current, the data information in the first data storage 110a is determined to be logic "1" and the first data storage 110a is determined to be at the un-programmed state.

Alternatively, because the second bit effect raises a barrier for reading the data information from a target data storage neighboring to another data storage being at the programmed state, it is difficult to determine the data information of the target data storage in the memory cell by simply mapping the sensed current to a programmed state when the sensed current is smaller than the reference current. In terms of the threshold voltage, the smaller the current is, the higher the threshold voltage is. As shown in FIG. 4A, when the sensed current for reading data information from the target data storage is smaller than the reference current, the threshold voltage of the target data storage is higher than the reference voltage with respect to the reference. However, as shown in FIG. 4A, not only the data storage with bit "0" has the threshold voltage higher than the reference voltage, but also the data storage with bit "1" under the second bit effect has the threshold voltage higher than the reference voltage. Therefore, by simply referring to the sensed current of the target data storage, it is difficult to determine whether the bit in the target data storage is logic "1" of the memory cell with a programmed state under the second bit effect or the bits in the target data storage is simply logic "0" when the threshold voltage is larger than the reference voltage.

Figure 6A:
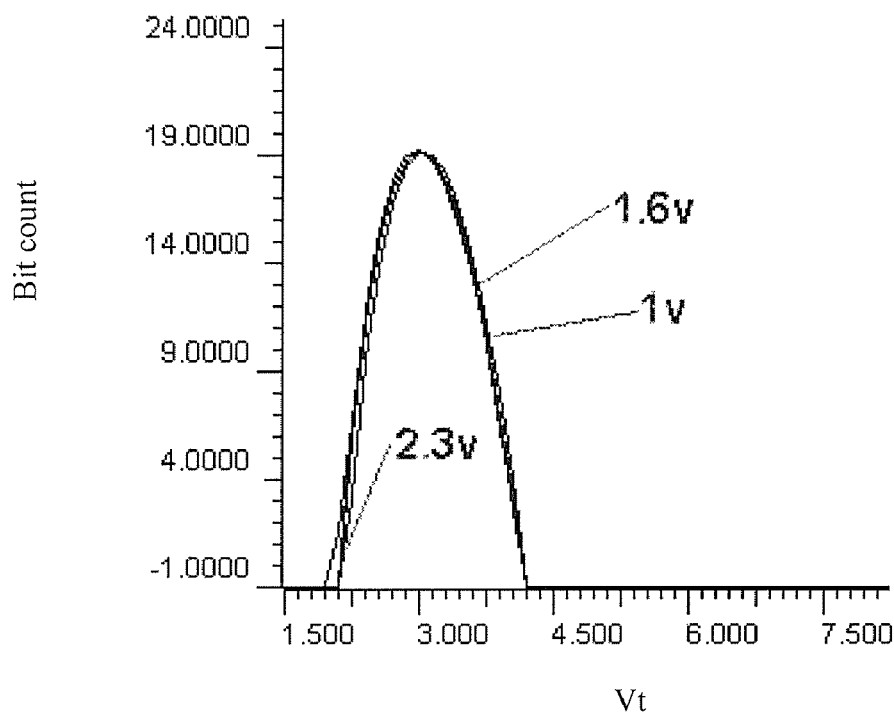
FIG. 6A is a plot diagram showing threshold voltage distributions of a data storage in a memory cell at un-programmed state "11" with various bit line voltages according to one embodiment of the present invention.
Figure 6B:
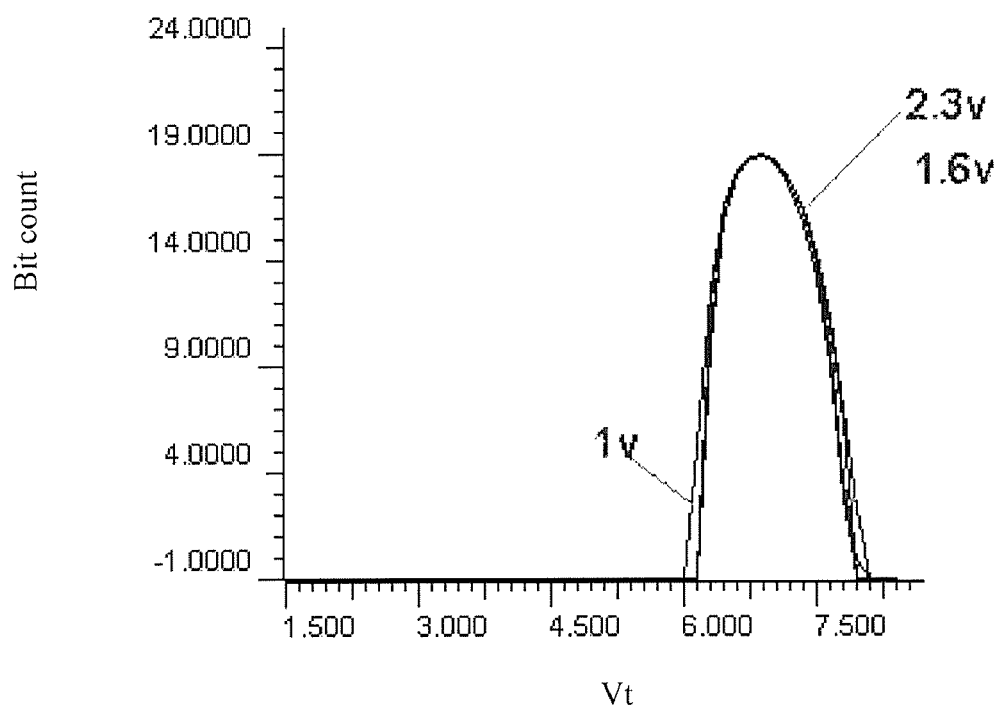
FIG. 6B is a plot diagram showing threshold voltage distributions of a data storage in a memory cell at programmed state "00" with various bit line voltages according to one embodiment of the present invention.

FIG. 6A is a plot diagram showing threshold voltage distributions of a data storage in a memory cell at programmed state "11" with various bit line voltages according to one embodiment of the present invention. FIG. 6B is a plot diagram showing threshold voltage distributions of a data storage in a memory cell at programmed state "00" with various bit line voltages according to one embodiment of the present invention. It should be noticed that the bit line voltage variation as show in FIG. 6A, 6B, 6C can be conducted by probing different voltage onto the bit lines through an external power device. As shown in FIG. 6A, no matter how the bit line voltage is changed from 1V to 1.6V and 2.3V, the patterns of threshold voltage distributions of the bits "1" of the memory cells 100 with a "11" programmed state are almost the same. Further, after the voltage deviation factor due to the current varying with different bit line voltage is excluded, the threshold voltage distributions with respect to different bit line voltages are not shifted away from each other. Similarly, as shown in FIG. 6B, it is clear that the patterns of threshold voltage distributions of the bits "0" of the memory cells 100 with a "00" programmed state are almost the same. Also, after the voltage deviation factor is excluded, the threshold voltage distributions are not shifted away from each other. It should be noticed that both of the threshold voltage distribution of bits "0" of the memory cells 100 with a "00" programmed state and the threshold voltage distribution of bits "1" of the memory cells 100 with a "11" programmed state are not affected by applying different bit line voltages.

Figure 6C:
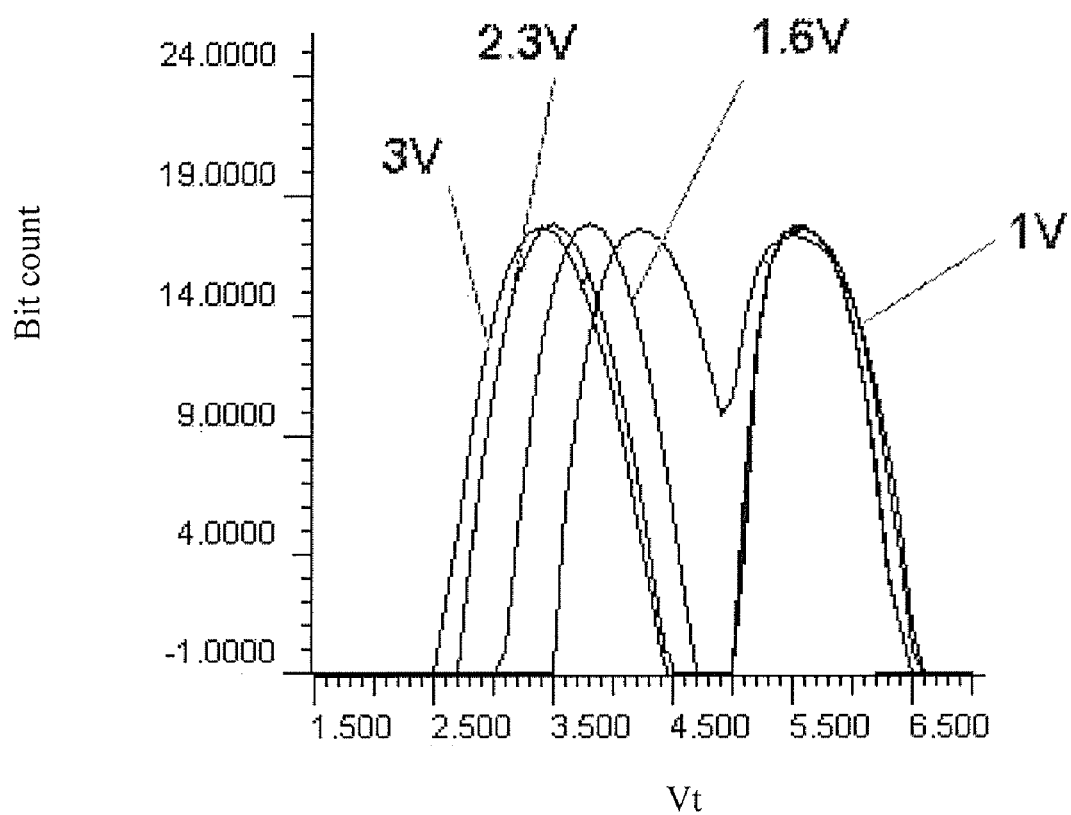
FIG. 6C is a plot diagram showing threshold voltage distributions of a data storage in a memory cell at programmed state "01"/"10" with various bit line voltages according to one embodiment of the present invention.

FIG. 6C is a plot diagram showing threshold voltage distributions of a data storage in a memory cell at programmed state "01"/"10" with various bit line voltages according to one embodiment of the present invention. Moreover, as shown in FIG. 6C, the threshold voltage distribution group 602 indicates the distribution of threshold voltages of the bits "0" of the memory cells 100 with a "10" or "01" programmed state while the bit line voltage is changed from 1V to 1.6V, 2.3V and 3V. Further, the threshold voltage distribution group 604 indicates the distribution of threshold voltages of the bits "1" of the memory cells 100 with a "01" or "10" programmed state while the bit line voltage is changed from 1V to 1.6V, 2.3V and 3V. as shown in FIG. 6C, it is clear that the patterns of the threshold voltage distributions in the distribution group 602 of the bits "0" of the memory cells 100 with a "10" or "01" programmed state are almost the same. Also, after the voltage deviation factor is excluded, the threshold voltage distributions are not shifted away from each other.

However, as shown in distribution group 604, the patterns of the threshold voltage distributions of the bits "1" of the memory cells 100 with a "10" or "01" programmed state are slightly distorted. Most importantly, after the voltage deviation factor is excluded, the threshold voltage distributions are shifted toward to lower threshold voltages with the change of the bit line voltages from 1V to 1.6V, 2.3V and 3V Apparently, as shown in FIG. 6A, FIG. 6B and FIG. 6C, only the data storage having the bits of "1" with second bit effect is strongly affected by the change of the bit line voltage. That is, only the threshold voltage distribution of the bits "1" under the second bit effect would drastically shifted. Therefore, when the threshold voltage is larger than the reference voltage, in which the sensed current is smaller than the reference current, the data information of the data storage can be accurately determined by further detecting the variation of the current of the memory cell with applying different bit line voltages.

More particularly, as shown in FIG. 4B, when a second bit line voltage larger than the first bit line voltage is applied onto the source/drain region 104 away from the data storage to be read and the word line voltage is remaining the same, a second current is sensed. If the data storage to be read is at the programmed state, the variation of the sensed current at different applied bit line voltage is smaller than or equal to the voltage deviation factor which is represented by the reference current deviation due to different applied bit line voltage. That is, as shown in FIG. 4A and FIG. 4B, in terms of the threshold voltage, the threshold voltage distribution 406' of the data storage at the programmed state in FIG. 4B is right shifting with a voltage difference D1 with reference to the threshold voltage distribution 406 in FIG. 4A, which is smaller than or equal to the reference voltage difference Dr with respect to reference current variation while different bit line voltage is applied.

If the data storage to be read is at the un-programmed state with the second bit effect, the variation of the sensed current at different applied bit line voltage is larger than the voltage deviation factor due to different applied bit line voltage. On the other words, as shown in FIG. 4A and FIG. 4B, in terms of the threshold voltage, the threshold voltage distribution 404' of the data storage at the un-programmed state with the second bit effect in FIG. 4B is right shifting with a voltage difference D2 with reference to the threshold voltage distribution 404 in FIG. 4A, which is larger than the reference voltage difference Dr with respect to reference current variation while different bit line voltage is applied.

Hence, as shown in FIG. 5, when the first current is smaller than the reference current, a second bit line voltage, which is different from the first bit line voltage, is applied onto the source/drain region 104 away from the first data storage 110a and the word line voltage is remaining the same so as to sense a second current (step S507). It should be noticed that the second bit line voltage is larger than the first bit line voltage. Then, in the step S509, the difference between second current and the first current is compared with the reference current deviation due to different bit line voltage applied onto the memory cell 100. That is, by excluding the voltage deviation factor due to different applied bit line voltages, the true behavior of the threshold voltage distribution after different bit line voltages are applied can be detected. Therefore, when the difference between the first current is smaller than or equal to the difference between the first reference current with respect to the first bit line voltage and a second reference current with respect to the second bit line voltage, the threshold voltage distribution of the first data storage is not affected by the different applied bit line voltage. Therefore, the data information of the first data storage 110a is determined to be logic "0" and the first data storage 110a is determined to be at the programmed state (step S511).

On the other hand, when the difference between the first current is larger than the difference between the first reference current with respect to the first bit line voltage and a second reference current with respect to the second bit line voltage, the threshold voltage distribution of the first data storage is seriously affected by the different applied bit line voltage. Therefore, the data information of the first data storage 110a is determined to be logic "1" with second bit effect and the first data storage 110a is determined to be at the un-programmed state (step S505).

Figure 7:
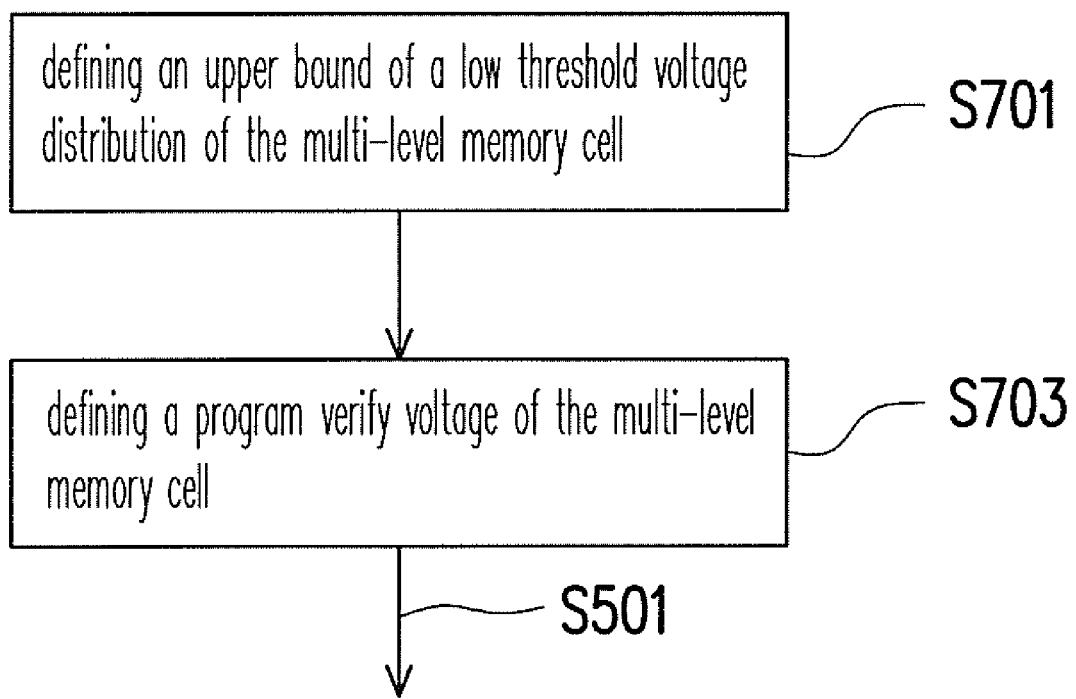
FIG. 7 is a flow chart showing steps for defining the process window according to one embodiment of the present invention.

FIG. 7 is a flow chart showing steps for defining the process window according to one embodiment of the present invention. According to the embodiment of the present invention, as shown in FIG. 7, before the first data storage 110a or the second data storage 110b is read or programmed, the present invention further comprises steps of defining an upper bound of a low threshold voltage distribution of the memory cell (S701) and defining a program verify voltage of the memory cell (step S703). Noticeably, the difference between the program verify voltage and the upper bound of the low threshold voltage distribution of the memory cell can be as small as 600 mV. Furthermore, the execution sequences of steps S701 and S703 couldn't be altered.

Figure 8:
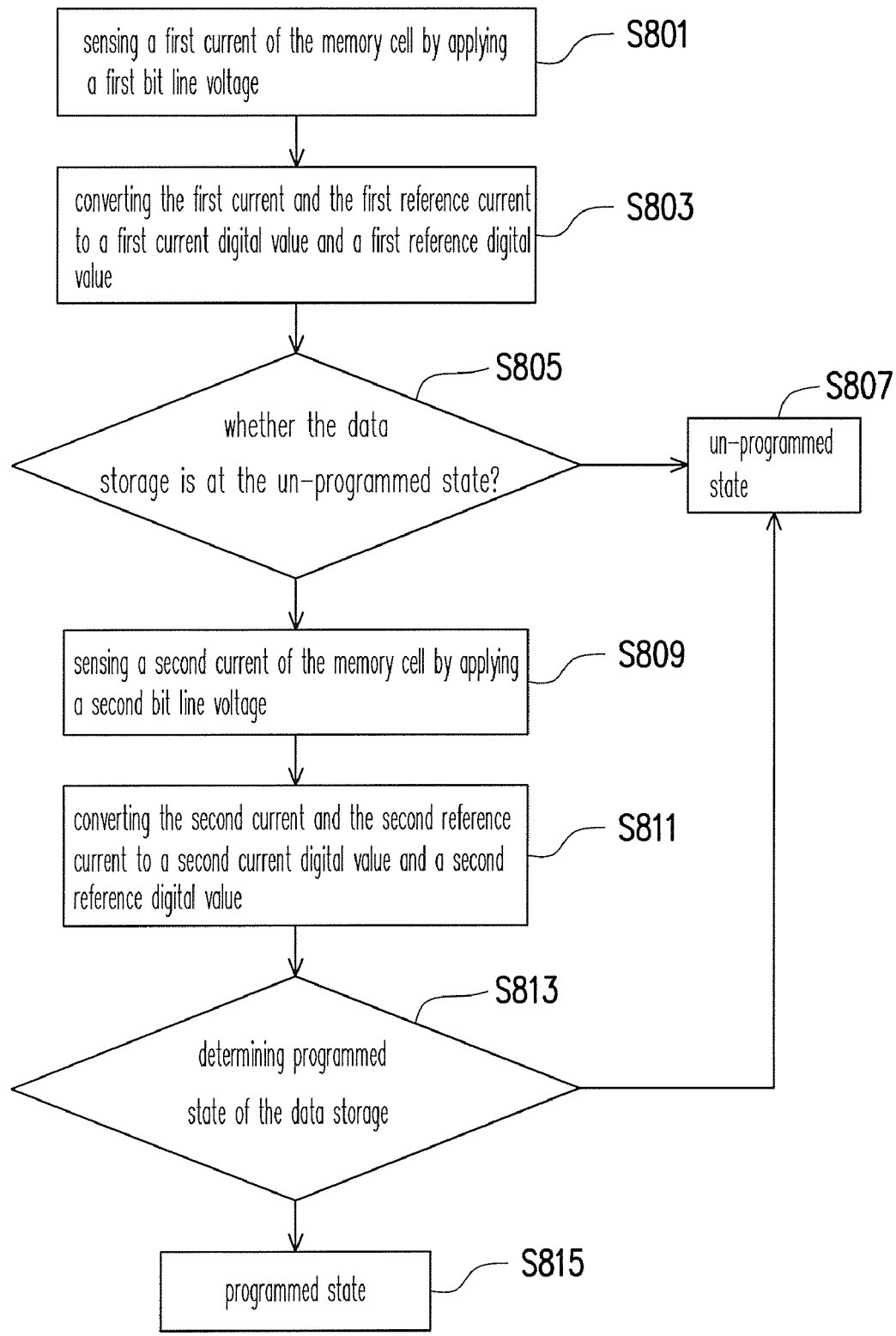
FIG. 8 is a flow chart showing a method for reading a memory cell of the memory according to one embodiment of the present invention.

FIG. 8 is a flow chart showing a method for reading a memory cell of the memory according to one embodiment of the present invention. In another embodiment, as shown in FIG. 8, a first current induced by the first bit line voltage on the source/drain region 104 away from the data storage to be read is sensed (step S801). Then, in the step S803, the first current and the first reference current with respect to the first bit line voltage and the word line voltage applied onto the memory cell 100 are analog-to-digital converted to a first current digital value and a first reference digital value respectively to be recorded. In the Step S805, the first current digital value is compare with the first reference digital value to determine the programming status of the to-be-read data storage. When the first current digital value is larger than the first reference digital value, the data storage to be read is determined to be at the un-programmed state (step S807). On the other hand, when the first current digital value is smaller than the first digital value, the data storage cannot not be surely determined whether it is at the programmed state or it is at the un-programmed state with the second bit effect.

Furthermore, as shown in FIG. 8, in the step S809, when the first current digital value is smaller than the first digital value, a second bit line voltage, which is different from the first bit line voltage, is applied onto the source/drain region 104 away from the data storage to be read and the word line voltage is remaining the same so as to sense a second current. Then, in the step S811, the second current and the second reference current with respect to the second bit line voltage and the word line voltage applied onto the memory cell 100 are analog-to-digital converted to a second current digital value and a second reference digital value respectively to be recorded. Further, in the step S813, the programming status of the data storage to be read is determined. That is, the difference between second current digital value and the first current digital value is compared with the reference digital value deviation due to different bit line voltage applied onto the memory cell 100. If the difference between the second current digital value and the first current digital value is smaller than or equal to the difference between the first reference digital value and the second reference digital value, the data storage to be read is determined to be at the programmed state (step S815). If the difference between the second current digital value and the first current digital value is larger than the difference between the second reference digital value and the first reference digital value, the data storage to be read is determined to be at the un-programmed state with the second bit effect (step S807).

In the present invention, when reading data from each data storage in the memory cell, the behavior of the threshold voltage distribution of the target data storage under different bit line voltage is used to determine the programmed state of the target data storage. Thus, even if the operation window is small and even closed, the data storage with bit of "1" under second bit effect and the data storage with bit of "0" can be correctly distinguished from each other while the sensing current is smaller than the reference current. Therefore, the operation window would no longer be a barrier for scaling down the dimension of the memory cell. Furthermore, the second bit effect on the operation of the memory cell is alleviated. Furthermore, since the second bit effect is alleviated and the operation window is small, the programming speed is increased and the time for programming the memory cell is reduced.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for operating a memory cell having a data storage, comprising:
   sensing a first current of the memory cell with applying a first bit line voltage onto the memory cell;
   determining the data storage to be at an un-programmed state not under a second-bit effect if the first current is larger than a first reference current; and
   sensing a second current of the memory cell with applying a second bit line voltage onto the memory cell if the first current is smaller than the first reference current, and comparing a first difference between the first current and the second current with a second difference between the first reference current and a second reference current to determine the state of the data storage.

2. The method of claim 1, wherein the data storage is determined as an un-programmed state under the second-bit effect when the first difference is larger than the second difference, and as an programmed state when the first difference is smaller than or equal to the second difference.

3. The method of claim 1, wherein a first word line voltage that is applied when the first current is sensed is equal to a second word line voltage that is applied when the second current is sensed.

4. The method of claim 1, wherein an operation window of the memory cell is about 600 mV.

5. The method of claim 1 further comprising:
   defining an upper bound of a low threshold voltage distribution of the memory cell; and
   defining a program verify voltage of the memory cell.

6. The method of claim 5, wherein the difference between the program verify voltage and the upper bound of the low threshold voltage distribution is about 600 mV.

7. The method of claim 1 further comprising:
   analog-to-digital converting the first current and the first reference current to be forms of digital values respectively after the step of sensing the first current; and
   analog-to-digital converting the second current and the second reference current to be forms of digital values respectively after the step of sensing the second current.

8. A memory apparatus, comprising:
   a memory having a plurality of memory cells, each of the memory cells having a data storage;
   a sense circuit for sensing a first current of the memory cell with applying a first bit line voltage onto the memory cell during a reading process, and for sensing a second current of the memory cell with applying a second bit line voltage onto the memory cell if the first current is smaller than a first reference current; and
   a controller for applying the reading process on each of the memory cells, for determining the data storage to be at an un-programmed state not under a second-bit effect if the first current is larger than the first reference current, and for comparing a first difference between the first current and the second current with a second difference between the first reference current and a second reference current to determine the state of the data storage.

9. The memory apparatus of claim 8, wherein the second bit line voltage is different from the first bit line voltage.

10. The memory apparatus of claim 8, wherein the second bit line voltage is larger than the first bit line voltage.

11. The memory apparatus of claim 8, wherein a first word line voltage for sensing the first current is equal to a second word line voltage for sensing the second current.

12. The memory apparatus of claim 8, wherein an operation window of the memory cell is about 600 mV.

13. The memory apparatus of claim 8 further comprising an analog-to-digital converter for converting the first current and the first reference current to be forms of digital values respectively after the step of sensing the first current and converting the second current and the second reference current to be forms of digital values respectively after the step of sensing the second current.

14. The method of claim 1, wherein the second bit line voltage is larger than the first bit line voltage.

* * * * *